US011705650B2

(12) United States Patent
Ammon et al.

(10) Patent No.: US 11,705,650 B2
(45) Date of Patent: Jul. 18, 2023

(54) POWER ELECTRONIC ASSEMBLY WITH AN ELECTRICALLY CONDUCTIVE SLEEVE AND WITH A CIRCUIT CARRIER

(71) Applicant: SEMIKRON ELEKTRONIK GMBH & CO. KG, Nuremberg (DE)

(72) Inventors: Jörg Ammon, Erlangen (DE); Harald Kobolla, Seukendorf (DE); Jürgen Riegel, Rosstal (DE)

(73) Assignee: SEMIKRON ELEKTRONIK GMBH & CO. KG, Nuremberg (DE)

(*) Notice: Subject to any disclaimer, the term of this patent is extended or adjusted under 35 U.S.C. 154(b) by 309 days.

(21) Appl. No.: 17/318,566

(22) Filed: May 12, 2021

(65) Prior Publication Data

US 2021/0376504 A1    Dec. 2, 2021

(30) Foreign Application Priority Data

Jun. 2, 2020  (DE) ..................... 10 2020 114 650.7

(51) Int. Cl.
*H01R 12/57*    (2011.01)
*H01R 13/10*    (2006.01)
*H05K 1/18*     (2006.01)

(52) U.S. Cl.
CPC ............. *H01R 12/57* (2013.01); *H01R 13/10* (2013.01); *H05K 1/181* (2013.01); *H05K 2201/10325* (2013.01)

(58) Field of Classification Search
CPC ........ H01R 12/57; H01R 13/10; H01R 12/51; H05K 1/181; H05K 2201/10325;
(Continued)

(56) References Cited

U.S. PATENT DOCUMENTS 2,967,285 A * 1/1961 Freitas ................... H02B 1/207
                                                        439/48
3,218,606 A * 11/1965 Schultz ................ H01R 12/718
                                                        439/82
(Continued)

FOREIGN PATENT DOCUMENTS

DE       102005017849 A1    10/2006
DE       102008005547 A1    11/2009
DE    10 2020 114 650.7      6/2020

OTHER PUBLICATIONS

DE 10 2020 114 650.7, German Search Report dated Feb. 2, 2021, 3 pages—German, 3 pages—English.

*Primary Examiner* — Truc T Nguyen
(74) *Attorney, Agent, or Firm* — Andrew F. Young; Nolte Lackenbach Siegel

(57) ABSTRACT

A power electronic assembly with a sleeve that has a virtual longitudinal axis and a circuit carrier. The sleeve has a tube-shaped plug-in section which runs around the longitudinal axis, and a first base section arranged at a first end of the plug-in section and runs around the longitudinal axis and extends away from the longitudinal axis. The first base section has at its end a flat first contact surface which runs around the longitudinal axis in a closed manner and which runs in a first plane which runs perpendicular to the longitudinal axis. The first base section has an edge surface which runs around the longitudinal axis in a closed manner and the first base section has a second contact surface which runs from the first contact surface and away from the first plane in the direction towards the edge surface.

14 Claims, 5 Drawing Sheets

(58) Field of Classification Search
CPC .................. H05K 3/301; H05K 3/341; H05K 2201/10242; H05K 2201/10333; H05K 2201/10916; H05K 3/3426; Y02P 70/50
See application file for complete search history.

(56) References Cited

U.S. PATENT DOCUMENTS

| | | | | |
|---|---|---|---|---|
| 3,812,381 | A * | 5/1974 | Guyton | H01R 12/52 |
| | | | | 439/55 |
| 4,065,850 | A * | 1/1978 | Burr | H01R 9/20 |
| | | | | 29/853 |
| 4,175,816 | A * | 11/1979 | Burr | H05K 3/4046 |
| | | | | 439/406 |
| 4,570,338 | A * | 2/1986 | Ignatowicz | H01R 12/53 |
| | | | | 439/876 |
| 5,295,862 | A * | 3/1994 | Mosquera | H01R 12/7064 |
| | | | | 439/82 |
| 6,623,283 | B1 * | 9/2003 | Torigian | H05K 3/3426 |
| | | | | 439/876 |
| 7,988,455 | B2 * | 8/2011 | Blakborn | H01R 43/20 |
| | | | | 439/63 |
| 9,255,596 | B2 * | 2/2016 | Diehl | B29C 66/721 |
| 9,406,633 | B2 * | 8/2016 | Isozaki | H01L 24/13 |
| 2008/0132090 | A1 * | 6/2008 | Bozzone | H01R 12/718 |
| | | | | 439/38 |
| 2009/0011619 | A1 * | 1/2009 | Akama | H01R 24/50 |
| | | | | 439/63 |
| 2015/0099162 | A1 * | 4/2015 | Wu | H01M 50/514 |
| | | | | 429/178 |
| 2018/0034205 | A1 * | 2/2018 | Ikeda | H01R 4/60 |
| 2019/0036249 | A1 * | 1/2019 | Joerg | H01R 43/0256 |
| 2019/0380204 | A1 * | 12/2019 | Cartier, Jr. | H05K 3/3405 |

* cited by examiner

POWER ELECTRONIC ASSEMBLY WITH AN ELECTRICALLY CONDUCTIVE SLEEVE AND WITH A CIRCUIT CARRIER

CROSS REFERENCE TO RELATED APPLICATIONS

This application relates to and claims priority to DE 10 2020 114 650.7 filed Jun. 2, 2020, the entire contents of which are incorporated herein by reference.

FIGURE SELECTED FOR PUBLICATION

FIG. 4

BACKGROUND OF THE INVENTION

Field of the Invention

The invention relates to a power electronic assembly with an electrically conductive sleeve, which has a virtual longitudinal axis and is formed in one piece, and with a circuit carrier, wherein the sleeve has a tube-shaped plug-in section, which runs around the longitudinal axis, and a first base section, which is arranged at a first end of the plug-in section, runs around the longitudinal axis, and extends away from the longitudinal axis. The first base section is arranged on a conductor track of the circuit carrier and is connected to the conductor track via an electrically conductive connecting means in an electrically conductive manner.

Description of the Related Art

A power electronic assembly with an electrically conductive sleeve, which extends in a longitudinal direction, and with a circuit carrier is known from DE 10 2008 005 547 A1. At its first end region, the sleeve has a first flanging which is designed in such a way that, when the sleeve is placed with the first flanging first on a plane which is perpendicular to the longitudinal direction z, it has with this plane a number N1>=2 of first contact surfaces which are spaced apart from one another. The first flanging is arranged on a conductor track of the circuit carrier and is connected to the conductor track via a solder in an electrically conductive manner.

ASPECTS AND SUMMARY OF THE INVENTION

The object of the invention is to create a power electronic assembly with a sleeve and a circuit carrier, wherein the sleeve is connected to a conductor track of the circuit carrier in an electrically conductive manner and in a mechanically stable and reliable manner.

This object is achieved by a power electronic assembly with an electrically conductive sleeve, which has a virtual longitudinal axis and is formed in one piece, and with a circuit carrier, wherein the sleeve has a tube-shaped plug-in section, which runs around the longitudinal axis, and a first base section, which is arranged at a first end of the plug-in section, runs around the longitudinal axis, and extends away from the longitudinal axis, wherein the first base section has at its end a flat first contact surface which runs around the longitudinal axis in a closed manner and which runs in a first plane which runs perpendicular to the longitudinal axis, wherein the first base section has an edge surface which runs around the longitudinal axis in a closed manner, wherein the first base section has a second contact surface which runs from the first contact surface and away from the first plane in the direction towards the edge surface and runs around the longitudinal axis in a closed manner, wherein the first base section has a third contact surface which runs from the first contact surface and away from the first plane in the direction towards a hollow space of the plug-in section and runs around the longitudinal axis in a closed manner, wherein the first base section is arranged on a conductor track of the circuit carrier and is connected to the conductor track via an electrically conductive connecting means in an electrically conductive manner, wherein the connecting means has a mechanical contact with the first, second and third contact surface and with the conductor track.

It proves to be advantageous if the connecting means is designed as a solder or as an electrically conductive adhesive. This makes it possible to produce the power electronic assembly efficiently.

Furthermore, it proves to be advantageous if the second contact surface has a common first line of intersection, which runs in a straight line, with a second plane which runs in the direction of the longitudinal axis and in the radial direction relative to the longitudinal axis. As a result, when producing the electrically conductive connection of the first base section with the conductor track of the circuit carrier by means of the connecting means, a part of the connecting means arranged between the first contact surface and the conductor track, in an analogous manner to capillary action, is drawn into the wedge-shaped gap between the second contact surface and the conductor track in a very effective manner. Impurities which may be present in the connecting means and in particular gas bubbles contained within the connecting means are directed away to the outside in a very effective manner by way of the straight, oblique course of the second contact surface.

In this context, it proves to be advantageous if the first line of intersection relative to the first plane has an angle of 10° to 60°, in particular 20° to 50°. As a result, impurities which may be present in the connecting means and in particular gas bubbles contained within the connecting means are directed away to the outside in a particularly effective manner by way of the straight, oblique course of the second contact surface.

Furthermore, it proves to be advantageous if the third contact surface has a common second line of intersection, which runs in a straight line, with a second plane which runs in the direction of the longitudinal axis and in the radial direction relative to the longitudinal axis. As a result, when producing the electrically conductive connection of the first base section with the conductor track of the circuit carrier by means of the connecting means, a part of the connecting means arranged between the first contact surface and the conductor track, in an analogous manner to capillary action, is drawn into the wedge-shaped gap between the third contact surface and the conductor track in a very effective manner. Impurities which may be present in the connecting means and in particular gas bubbles contained within the connecting means are directed away inwards in the direction of the hollow space in a very effective manner by way of the straight, oblique course of the third contact surface.

In this context, it proves to be advantageous if the second line of intersection relative to the first plane has an angle of 10° to 40°, in particular 15° to 30°. As a result, impurities which may be present in the connecting means and in particular gas bubbles contained within the connecting means are directed away inwards in the direction of the hollow space in a particularly effective manner by way of the straight, oblique course of the third contact surface.

It further proves to be advantageous if in the radial direction relative to the longitudinal axis, the width of the first contact surface is 0.1 to 0.3 times, in particular 0.125 to 0.25 times, the distance of the edge surface relative to the inner surface of the plug-in section. As a result, when producing the electrically conductive connection of the first base section with the conductor track of the circuit carrier, a high level of stability of the sleeve arranged on the connecting means is achieved.

It further proves to be advantageous if in the radial direction relative to the longitudinal axis, the distance of the first contact surface relative to the edge surface is 0.75 to 1.25 times, in particular 0.8 to 1.2 times the distance of the first contact surface relative to the inner surface of the plug-in section. As a result, when producing the electrically conductive connection of the first base section with the conductor track of the circuit carrier, a high level of stability of the sleeve arranged on the connecting means is achieved.

It further proves to be advantageous if in the radial direction relative to the longitudinal axis, the distance of the first contact surface relative to the edge surface is 0.2 to 0.7 times, in particular 0.2 to 0.5 times the distance of the first contact surface relative to the inner surface of the plug-in section. As a result, when producing the electrically conductive connection of the first base section with the conductor track of the circuit carrier, a particularly high level of stability of the sleeve arranged on the connecting means is achieved.

Furthermore, it proves to be advantageous if the sleeve has a second base section which is arranged at a second end, arranged opposite the first end, of the plug-in section, runs around the longitudinal axis, and extends away from the longitudinal axis, wherein the second base section is designed in an identical manner to the first base section. This simplifies an efficient production of the power electronic assembly, since it is irrelevant when producing the electrically conductive connection of the sleeve with the conductor track of the circuit carrier whether the sleeve is arranged on the conductor track with its first or with its second base section. In this case, the sleeve basically has two first base sections which are arranged opposite one another.

Furthermore, it proves to be advantageous if the wall thickness of the plug-in section is 0.1 mm to 0.2 mm.

It further proves to be advantageous if the height of the sleeve is 1 mm to 10 mm, in particular 2 mm to 4 mm.

It further proves to be advantageous if the diameter of the circular path on which the edge surface runs around the longitudinal axis in a closed manner is 1.5 mm to 2.5 mm.

It further proves to be advantageous if the inner diameter of the plug-in section is 0.5 mm to 1 mm.

Furthermore, it proves to be advantageous if the sleeve is formed at least substantially from copper or a copper alloy. As a result, the sleeve has a high electrical conductivity. The sleeve can also have a nickel layer which is arranged on the copper or on the copper alloy, for example. The thickness of the nickel layer is preferably 0.2 μm to 5 μm, in particular 0.4 μm to 4 μm.

Furthermore, it proves to be advantageous if the circuit carrier is designed as a substrate or as a printed circuit board.

It should be noted that the power electronic assembly according to the invention can of course have a plurality of the sleeves described previously which, in an analogous manner to that which is described previously, are connected to the circuit carrier in an electrically conductive manner.

Furthermore, it should be noted that the transition from a surface to an adjacent surface generally takes place with a transition radius.

Furthermore, it should be noted that the term "straight" is not intended to be understood to mean a mathematically precise straightness, but rather production-related deviations or deviations within the normal technical tolerance range from a straight line are permissible and for the purposes of the invention fall under the term "straight".

The features specified in the singular in each case, in particular the sleeve, may of course be present multiple times in the assembly according to the invention, unless this is excluded explicitly or per se, or contradicts the concept of the invention.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
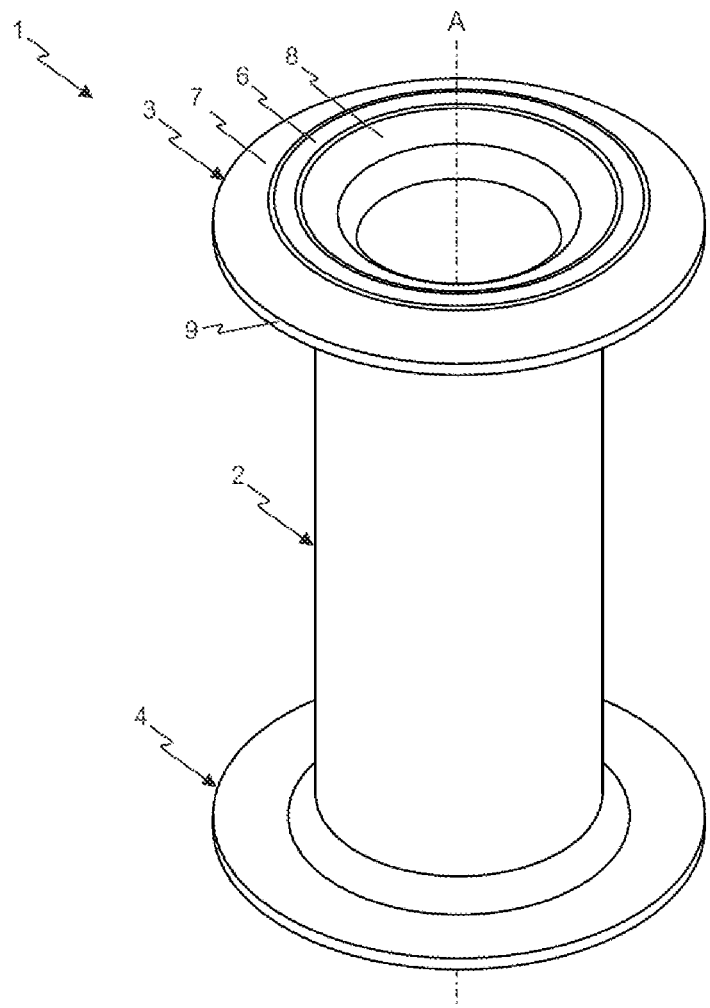
FIG. 1 shows a perspective representation of a configuration of a sleeve of a power electronic assembly according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
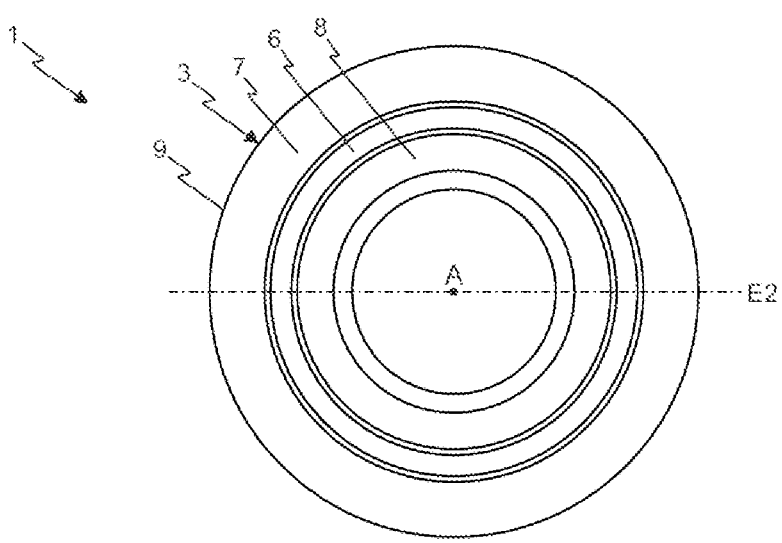
FIG. 2 shows a plan view of the sleeve according to FIG. 1.
Figure 3:
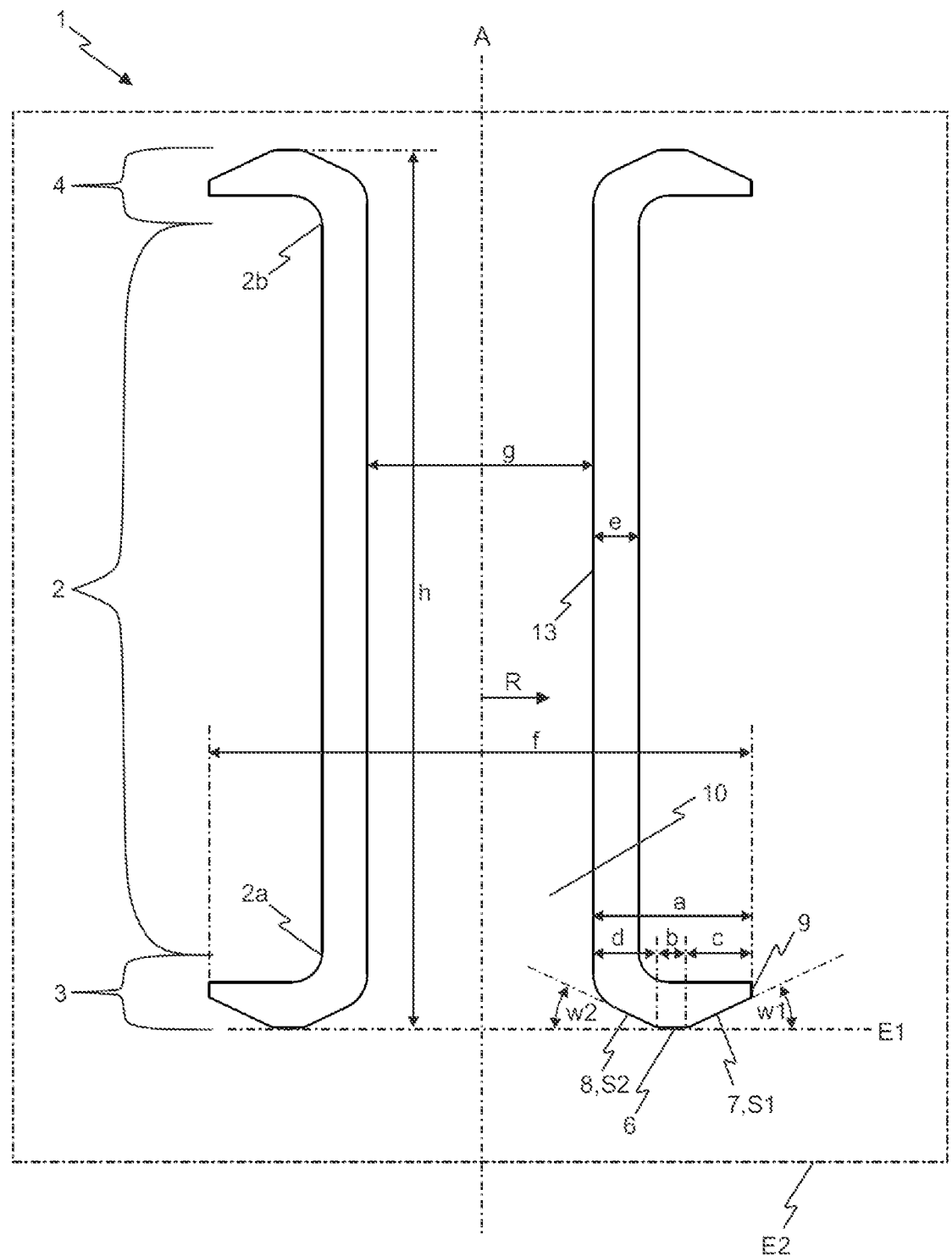
FIG. 3 shows a section view of the sleeve according to FIG. 1, wherein the sleeve is represented rotated by 180° in the drawing plane with respect to FIG. 1.
Figure 4:
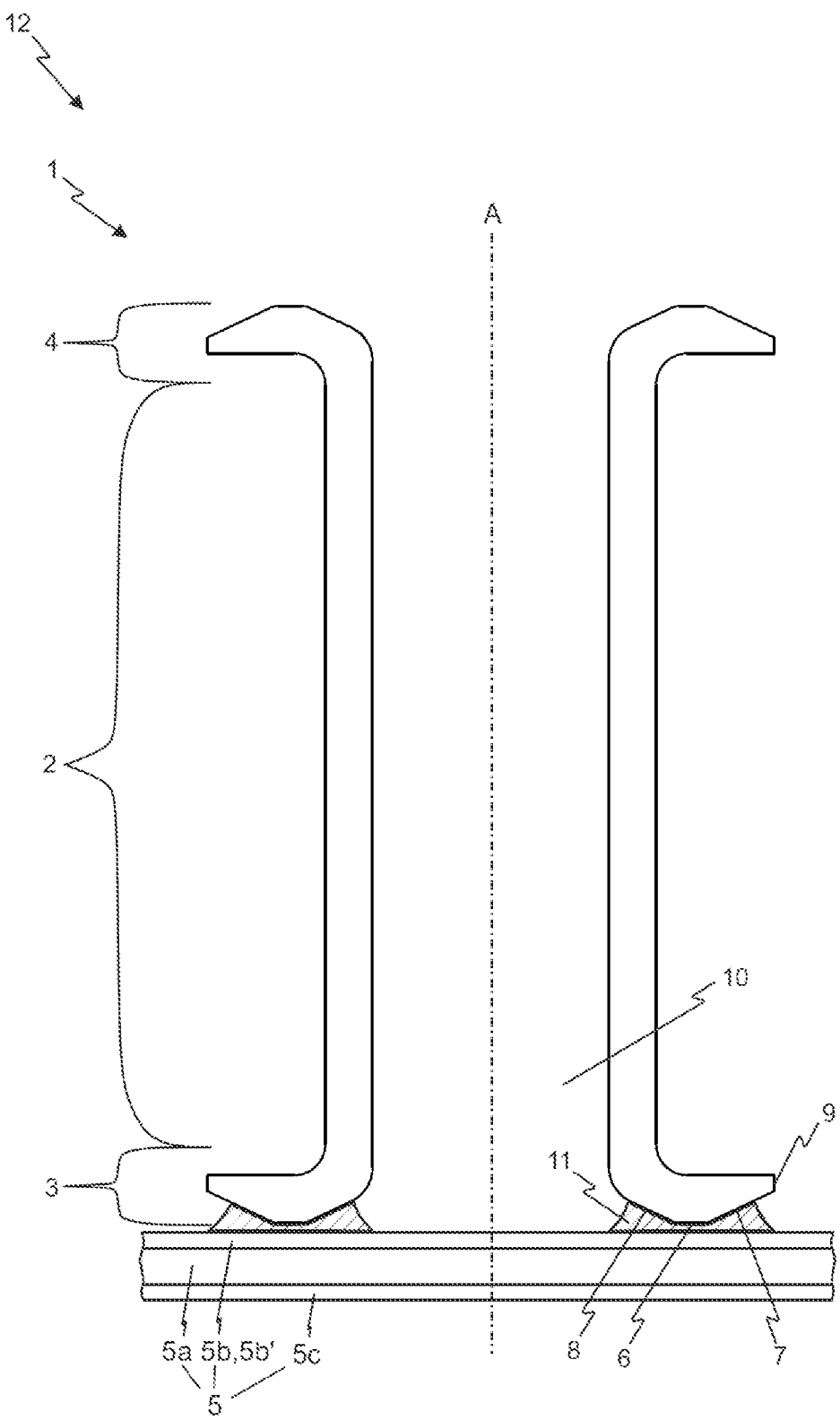
FIG. 4 shows a perspective representation of a power electronic assembly according to the invention with a sleeve according to FIG. 3 and with a circuit carrier.

FIG. 1 represents a perspective view of a configuration of a sleeve 1 of a power electronic assembly 12 according to the invention and FIG. 2 represents a plan view of the sleeve 1 according to FIG. 1. FIG. 3 represents a section view of the sleeve 1 according to FIG. 1, wherein the sleeve 1 is represented rotated by 180° in the drawing plane with respect to FIG. 1. FIG. 4 represents a perspective representation of the power electronic assembly 12 according to the invention with a sleeve 1 according to FIG. 3 and with a circuit carrier 5.

The power electronic assembly 12 according to the invention has an electrically conductive sleeve 1, which has a virtual longitudinal axis A and is formed in one piece, and a circuit carrier 5. The sleeve 1 is preferably formed at least substantially from copper or a copper alloy. The sleeve 1 can also have a nickel layer which is arranged on the copper or on the copper alloy, for example. The thickness of the nickel layer is preferably 0.2 μm to 5 μm, in particular 0.4 μm to 4 μm. Within the context of the exemplary embodiment, the circuit carrier 5 is designed as a substrate 5 but can also be designed as a printed circuit board, for example. The substrate 5 has an electrically non-conductive insulating layer 5a and a first metal layer 5b arranged on the insulating layer 5a and structured to form conductor tracks 5b', wherein FIG. 4 represents a single conductor track 5b'. The substrate 5 can have a second metal layer 5c which is arranged on the side of the insulating layer 5a which is opposite the first metal layer 5b. The insulating layer 5a can be designed as a ceramic plate, for example. The substrate 5 can be designed as a direct copper bonded substrate (DCB substrate), as an active metal brazing substrate (AMB substrate) or as an insulated metal substrate (IMS), for example.

The sleeve 1 has a tube-shaped plug-in section 2, which runs around the longitudinal axis A, and a first base section 3, which is arranged at a first end 2a of the plug-in section 2, runs around the longitudinal axis A, and extends away from the longitudinal axis A. The first base section 3 extends away from the longitudinal axis A in the radial direction R relative to the longitudinal axis A. The first base section 3 has at its end, more specifically at its axial end in relation to the longitudinal axis A, a flat first contact surface 6 which runs around the longitudinal axis A in a closed manner, and which runs in a first plane E1 which runs perpendicular to the longitudinal axis A. The first contact surface 6 forms, in relation to the longitudinal axis A, the axial end of the first base section 3. The contact surface 6 therefore forms a first end, more specifically an axial first end in relation to the longitudinal axis A, of the sleeve 1. Furthermore, the first contact surface 6 therefore runs around the longitudinal axis A in an uninterrupted manner in the first plane E1. The sleeve 1 only has one single first contact surface 6 which runs in the first plane E1. The first contact surface 6 has a constant width b in the radial direction R relative to the longitudinal axis A.

Furthermore, the first base section has an edge surface 9 which runs around the longitudinal axis A in a closed manner. The edge surface 9 therefore runs around the longitudinal axis A in an uninterrupted manner. The edge surface 9 runs around the longitudinal axis A on a circular path. Furthermore, the first base section 3 has a second contact surface 7 which runs from the first contact surface 6 and away from the first plane E1 in the direction towards the edge surface 9 and runs around the longitudinal axis A in a closed manner. The second contact surface 7 therefore runs around the longitudinal axis A in an uninterrupted manner. Furthermore, the first base section 3 has a third contact surface 8 which runs from the first contact surface 6 and away from the first plane E1 in the direction towards a hollow space 10 of the plug-in section 2 and runs around the longitudinal axis A in a closed manner. The third contact surface 8 therefore runs around the longitudinal axis A in an uninterrupted manner.

The first base section 3 is arranged on a conductor track 5b' of the circuit carrier 5 and is connected to the conductor track 5b' via an electrically conductive connecting means 11 in an electrically conductive manner, wherein the connecting means 11 has a mechanical contact with the first, second and third contact surface 6, 7, 8 and with the conductor track 5b'. The connecting means 11 is preferably designed as a solder or as an electrically conductive adhesive.

In order to produce the materially bonded, electrically conductive connection of the sleeve 1, more specifically of the first base section 3 of the sleeve 1, with the conductor track 5b' of the circuit carrier 5, the connecting means 11, here a solder 11 is arranged on the conductor track 5b' and the sleeve 1 is arranged on the solder 11 with its first base section 3. In this case, the first contact surface 6 has a mechanical contact with the solder 11. The solder 11 is then heated until it melts. The liquid solder 11 is drawn up by way of the course of the second and third contact surface 7 and 8 which runs from the first contact surface 6 and away from the first plane E1, i.e. here by way of the oblique course of the second and third contact surface 7 and 8, starting from the first contact surface 6 along the second and third contact surface 7 and 8. As a result, a part of the solder 11 arranged between the first contact surface 6 and the conductor track 5b', in an analogous manner to capillary action, is drawn into the respective gap between the second and third contact surface 7 and 8 and the conductor track 5b' and the first contact surface 6 sinks into the solder 11. A large-area mechanical contact of the solder 11 with the first, second and third contact surface 6, 7, 8 and with the conductor track 5b' is formed. Impurities which may be contained within the solder 11 and in particular gas bubbles contained within the solder 11 are directed away by way of the oblique course of the second and third contact surface 7 and 8 in the case of the second contact surface 7 to the outside and in the case of the third contact surface 8 inwards in the direction of the hollow space 10. The solder 11 is then cooled until it solidifies. The same effects and actions occur in an analogous manner when using an electrically conductive adhesive as a connecting means 11. The sleeve 1 is therefore connected to the conductor track 5b' of the circuit carrier 5 in an electrically conductive manner and in a mechanically stable and reliable manner.

The sleeve 1 is used as an electrical connection device for producing an electrically conductive connection of an electrically conductive contact pin (not represented in the figures) which is plugged into the plug-in section 2 and, as a result, has an electrically conductive contact with the sleeve 1, with the conductor track 5b' of the circuit carrier 5. The end region of the contact pin which faces away from the sleeve 1 can be soldered to an external printed circuit board, for example, or can be press-contacted with the external printed circuit board in an electrically conductive manner via a press-fit connection, for example.

The second contact surface 7 preferably has a common first line of intersection S1, which runs in a straight line, with a second plane E2 which runs in the direction of the longitudinal axis A and in the radial direction R relative to the longitudinal axis A. The first line of intersection S1 relative to the first plane E1 preferably has an angle w1 of 10° to 60°, in particular 20° to 50°.

The third contact surface 8 preferably has a common second line of intersection S2, which runs in a straight line, with the second plane E2. The second line of intersection S2 relative to the first plane E1 preferably has an angle w2 of 10° to 40°, in particular 15° to 30°.

As represented in FIG. 1 to FIG. 4 by way of example, in the radial direction R relative to the longitudinal axis A, the width b of the first contact surface 6 is preferably 0.1 to 0.3 times, in particular 0.125 to 0.25 times, the distance a of the edge surface 9 relative to the inner surface 13 of the plug-in section 2.

When forming the sleeve 1 according to FIG. 1 to FIG. 4, in the radial direction R relative to the longitudinal axis A, the distance c of the first contact surface 6 relative to the edge surface 9 is preferably 0.75 to 1.25 times, in particular 0.8 to 1.2 times the distance d of the first contact surface 6 relative to the inner surface 13 of the plug-in section 2.

Figure 5:
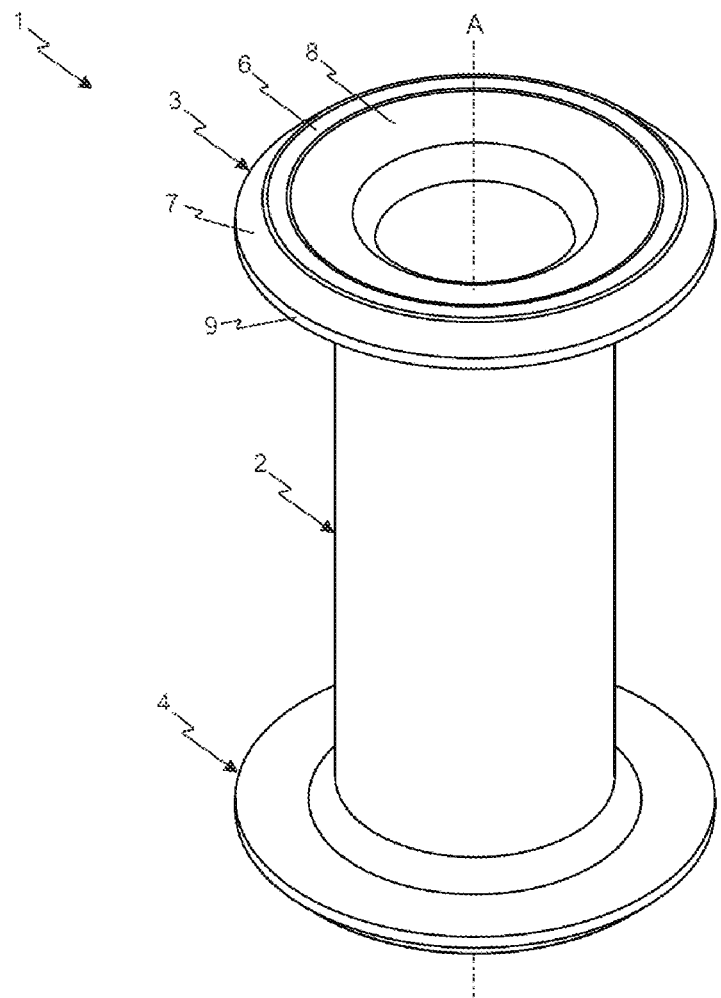
FIG. 5 shows a perspective representation of a further configuration of a sleeve of a power electronic assembly according to the invention.
Figure 6:
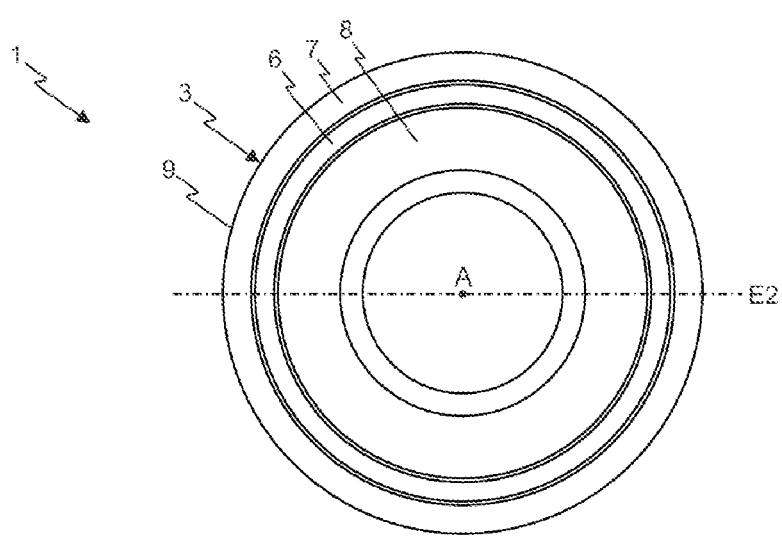
FIG. 6 shows a plan view of the sleeve according to FIG. 5.
Figure 7:
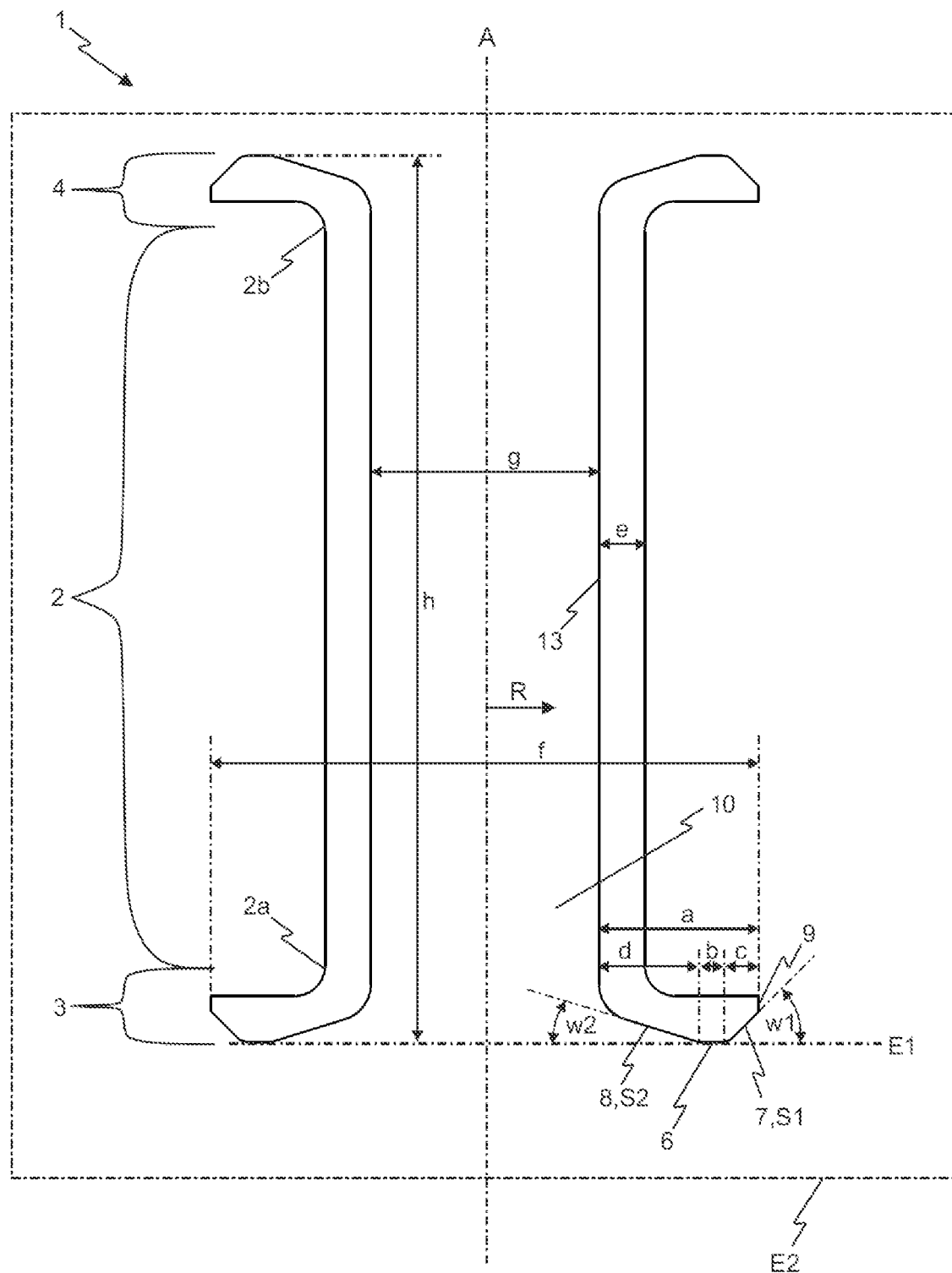
FIG. 7 shows a section view of the sleeve according to FIG. 5, wherein the sleeve is represented rotated by 180° in the drawing plane with respect to FIG. 5.

FIG. 5 to FIG. 7 represent a further configuration of a sleeve 1 of a power electronic assembly 12 according to the invention which, except for the feature that, in the case of the sleeve 1 according to FIG. 5 to FIG. 7, the first contact surface 6 is arranged far to the outside in the radial direction R, corresponds to the sleeve 1 according to FIG. 1 to FIG. 4 including advantageous configurations and variations of the configuration. Regarding the description of the sleeve 1 according to FIG. 5 to FIG. 7, reference is therefore made to the description of the sleeve 1 according to FIG. 1 to FIG. 4 in order to avoid repetitions. Owing to the first contact surface 6 which is arranged far to the outside, the sleeve 1, according to FIG. 5 to FIG. 7, has a higher level of stability compared to the sleeve 1 according to FIG. 1 to FIG. 4, so that the sleeve 1 according to FIG. 5 to FIG. 7, when producing the materially bonded, electrically conductive connection of the sleeve 1 with the conductor track 5b', if the sleeve 1 is arranged on the liquid solder 11 or on the adhesive 11, remains particularly reliably in an orientation perpendicular to the conductor track 5b', until the solder 11 solidifies or the adhesive 11 hardens. When forming the sleeve 1 according to FIG. 5 to FIG. 7, in the radial direction R relative to the longitudinal axis A, the distance c of the first contact surface 6 relative to the edge surface 9 is 0.2 to 0.7 times, in particular 0.2 to 0.5 times, the distance d of the first contact surface 6 relative to the inner surface 13 of the plug-in section 2.

The sleeve 1 preferably has a second base section 4 which is arranged at a second end 2b, arranged opposite the first end 2a, of the plug-in section 2, runs around the longitudinal axis A, and extends away from the longitudinal axis A, wherein the second base section 4 is designed in an identical manner to the first base section 3. The second base section 4 extends away from the longitudinal axis A in the radial direction R relative to the longitudinal axis. A.

The wall thickness e of the plug-in section 2 is preferably 0.1 mm to 0.2 mm.

The height h of the sleeve 1 is preferably 1 mm to 10 mm, in particular 2 mm to 4 mm.

The diameter f of the circular path on which the edge surface 9 runs around the longitudinal axis A in a closed manner is preferably 1.5 mm to 2.5 mm.

The inner diameter g of the plug-in section 2 is preferably 0.5 mm to 1 mm.

It should be noted at this point that features from different exemplary embodiments of the invention can of course be combined with one another as desired, provided that the features are not mutually exclusive, without departing from the scope of the invention.

Also, the inventors intend that only those claims which use the specific and exact phrase "means for" are intended to be interpreted under 35 USC 112, sixth paragraph. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic assembly, comprising:
a circuit carrier and an electrically conductive sleeve;
said electrically conductive sleeve has a tube-shaped plug-in section formed on one unitary piece bounding a hollow space in an enclosed manner and has a virtual longitudinal axis (A);
the tube-shaped plug-in section runs around the longitudinal axis (A), and has a first base section, which is arranged at a first end of the plug-in section, runs around the longitudinal axis (A), and extends away from the longitudinal axis (A);
the first base section has at its end a flat first contact surface which runs around the longitudinal axis (A) in a closed manner, and which runs in a first plane that runs perpendicular to the longitudinal axis (A);
the first base section has an edge surface which runs around the longitudinal axis (A) in a closed manner;
the first base section has a second contact surface which runs from the first contact surface and away from the first plane in the direction towards the edge surface and runs around the longitudinal axis (A) in a closed manner;
the first base section has a third contact surface which runs from the first contact surface and away from the first plane in the direction towards said hollow space of the plug-in section and runs around the longitudinal axis (A) in a closed manner;
the first base section is arranged on a conductor track of the circuit carrier and is connected to the conductor track via an electrically conductive connecting means in an electrically conductive manner;
the electrically conductive connecting means has a mechanical contact with the first contact surface, the second contact surface and the third contact surface and with the conductor track;
the electrically conductive connecting means is designed as a solder or as an electrically conductive adhesive; and
the second contact surface has a common first line of intersection (S1), which runs in a straight line, with a second plane (E2) which runs in the direction of the longitudinal axis (A) and in a radial direction (R) relative to the longitudinal axis (A).

2. The power electronic assembly, according to claim 1, wherein:
a first line of intersection (S1) relative to the first plane (E1) has an angle (w1) of 10° to 60°, in particular 20° to 50°.

3. The power electronic assembly, according to claim 1, wherein:
the third contact surface has a common second line of intersection (S2), which runs in a straight line, with the second plane (E2) which runs in a direction of the longitudinal axis (A) and in a radial direction (R) relative to the longitudinal axis (A).

4. The power electronic assembly, according to claim 3, wherein:
   a second line of intersection (S2) relative to the first plane (E1) has an angle (w2) of 10° to 40°, in particular 15° to 30°.

5. The power electronic assembly, according to claim 1, wherein:
   in a radial direction (R) relative to the longitudinal axis (A), a width (b) of the first contact surface is 0.1 to 0.3 times, in particular 0.125 to 0.25 times, a distance (a) of an edge surface relative to an inner surface of the plug-in section.

6. The power electronic assembly, according to claim 1, wherein:
   in a radial direction (R) relative to the longitudinal axis (A), a distance (c) of the first contact surface relative to an edge surface is 0.75 to 1.25 times, in particular 0.8 to 1.2 times a distance (d) of the first contact surface relative to an inner surface of the plug-in section.

7. The power electronic assembly, according to claim 1: wherein:
   in a radial direction (R) relative to the longitudinal axis (A), a distance (c) of the first contact surface relative to an edge surface is 0.2 to 0.7 times, in particular 0.2 to 0.5 times a distance (d) of the first contact surface relative to an inner surface of the plug-in section.

8. The power electronic assembly, according to claim 1, wherein:
   the sleeve has a second base section which is arranged at a second end opposite the first end, of the plug-in section, runs around the longitudinal axis (A), and extends away from the longitudinal axis (A); and
   wherein the second base section is designed in an inverted mirror manner to the first base section.

9. The power electronic assembly, according to claim 1, wherein:
   a wall thickness (e) of the plug-in section is 0.1 mm to 0.2 mm.

10. The power electronic assembly, according to claim 1, wherein:
    a height (h) of the sleeve is 1 mm to 10 mm, in particular 2 mm to 4 mm.

11. The power electronic assembly, according to claim 1, wherein:
    a diameter (f) of a circular path on which the edge surface runs around the longitudinal axis (A) in a closed manner is 1.5 mm to 2.5 mm.

12. The power electronic assembly, according to claim 1, wherein:
    an inner diameter (g) of the plug-in section is 0.5 mm to 1 mm.

13. The power electronic assembly, according to claim 1, wherein:
    the sleeve is formed at least substantially from copper or a copper alloy.

14. The power electronic assembly, according to claim 1, wherein:
    the circuit carrier is designed as a substrate or as a printed circuit board.

* * * * *